(12) United States Patent
Takebayashi et al.

(10) Patent No.: US 10,256,105 B2
(45) Date of Patent: Apr. 9, 2019

(54) DISC-SHAPED HEATER AND HEATER-COOLING-PLATE ASSEMBLY

(71) Applicant: NGK INSULATORS, LTD., Nagoya (JP)

(72) Inventors: Hiroshi Takebayashi, Handa (JP); Kengo Torii, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 15/681,582

(22) Filed: Aug. 21, 2017

(65) Prior Publication Data

US 2017/0345668 A1 Nov. 30, 2017

Related U.S. Application Data

(63) Continuation of application No. PCT/JP2016/088763, filed on Dec. 26, 2016.

(51) Int. Cl.
*H05B 3/68* (2006.01)
*H01L 21/3065* (2006.01)
(Continued)

(52) U.S. Cl.
CPC .......... *H01L 21/3065* (2013.01); *H01L 21/02* (2013.01); *H01L 21/67103* (2013.01);
(Continued)

(58) Field of Classification Search
CPC ................. H01L 21/263; H01L 21/324; H01L 21/67103; H01L 21/67109;
(Continued)

(56) References Cited

U.S. PATENT DOCUMENTS 4,217,483 A * 8/1980 Vogel ........................ H05B 3/82
174/138 R
4,993,616 A 2/1991 Yoshie et al.
(Continued)

FOREIGN PATENT DOCUMENTS

JP H04-20230 U 2/1992
JP 2005-303014 A1 10/2005
(Continued)

OTHER PUBLICATIONS

International Search Report and Written Opinion (Application No. PCT/JP2016/088763) dated Feb. 28, 2017.
(Continued)

*Primary Examiner* — Sang Y Paik
(74) *Attorney, Agent, or Firm* — Burr & Brown, PLLC

(57) ABSTRACT

An electrostatic chuck heater includes a disc-shaped ceramic base and a plurality of heating elements embedded in the ceramic base. A top surface of the electrostatic chuck heater, which serves as a wafer mounting surface, is divided into multiple zones. The heating elements, which each include terminals that are embedded in the ceramic base in the respective zones. Terminal collection regions are provided on a bottom surface of the electrostatic chuck heater. The number of terminal collection regions is smaller than the total number of heating elements. The terminals of each of the heating elements are connected to one of the terminal collection regions through the ceramic base.

6 Claims, 5 Drawing Sheets

Related U.S. Application Data

(60) Provisional application No. 62/271,581, filed on Dec. 28, 2015.

(51) Int. Cl.
  *H01L 21/02* (2006.01)
  *H01L 21/67* (2006.01)
  *H01L 21/683* (2006.01)
  *H05B 3/08* (2006.01)
  *H05B 3/28* (2006.01)

(52) U.S. Cl.
  CPC .. *H01L 21/67109* (2013.01); *H01L 21/67248* (2013.01); *H01L 21/6831* (2013.01); *H05B 3/08* (2013.01); *H05B 3/283* (2013.01)

(58) Field of Classification Search
  CPC .......... H01L 21/67248; H01L 21/6838; H01L 21/68792; H05B 3/00
  USPC .......................................... 219/443.1–468.2
  See application file for complete search history.

(56) References Cited

U.S. PATENT DOCUMENTS

| | | | | | |
|---|---|---|---|---|---|
| 7,247,819 | B2 * | 7/2007 | Goto | ................. | H01L 21/67103 219/444.1 |
| 8,525,418 | B2 * | 9/2013 | Morita | ................. | H01L 21/6831 219/121.4 |
| 2004/0175549 | A1 * | 9/2004 | Ito | ........................ | B32B 18/00 428/209 |
| 2005/0258160 | A1 | 11/2005 | Goto et al. | | |
| 2007/0068917 | A1 * | 3/2007 | Smith | ................. | G01N 27/4067 219/237 |
| 2009/0178764 | A1 * | 7/2009 | Kanno | ............. | H01L 21/67103 156/345.52 |
| 2009/0289048 | A1 * | 11/2009 | Casasso | ................. | F02P 19/022 219/262 |
| 2017/0140958 | A1 | 5/2017 | Kitagawa et al. | | |

FOREIGN PATENT DOCUMENTS

| | | |
|---|---|---|
| JP | 2015-109139 A1 | 6/2015 |
| JP | 2015-207765 A1 | 11/2015 |
| JP | 2015-220368 A1 | 12/2015 |

OTHER PUBLICATIONS

Japanese Office Action (Application No. 2017-525649) dated Apr. 24, 2018 (with English translation).

English translation of International Preliminary Report on Patentability (Chapter I) (Application No. PCT/JP2016/088763) dated Jul. 12, 2018, 7 pages.

* cited by examiner

Wiring pattern connecting to terminal collection region 16

DISC-SHAPED HEATER AND HEATER-COOLING-PLATE ASSEMBLY

The present application claims priority from U.S. Provisional Application No. 62/271,581, filed on Dec. 28, 2015, the entire contents of which are incorporated herein by reference.

BACKGROUND OF THE INVENTION

1. Field of the Invention

The present invention relates to a disc-shaped heater and a heater-cooling-plate assembly.

2. Description of the Related Art

Disc-shaped ceramic heaters have been known. For example, PTL 1 discloses a ceramic heater in which a heating surface is divided into a plurality of zones and resistance heating elements are embedded in a ceramic base in the respective zones. In this ceramic heater, each resistance heating element has independent input/output terminals. The bottom surface of the ceramic base has holes at positions such that the holes oppose the respective input/output terminals. Each input/output terminal is connected to a lead wire through the corresponding hole by, for example, brazing.

CITATION LIST

Patent Literature

PTL 1: JP 2005-303014 A

SUMMARY OF THE INVENTION

Unfortunately, the ceramic heater according to PTL 1 has a problem that it is difficult to sufficiently equalize the temperature over a wafer placed on the heating surface of the ceramic base. More specifically, as the number of zones increases, the number of terminals of the resistance heating elements increases accordingly, and the number of holes in the bottom surface of the ceramic base increases in accordance with the number of terminals. When the resistance heating elements generate heat, the regions of the ceramic heater in which the holes are formed serve as temperature singular points at which the temperature differs from those in regions free from the holes. When the number of temperature singular points is large, it is difficult to equalize the temperature over the wafer.

The present invention has been made to solve the above-described problem, and the main object of the present invention is to equalize the temperature over the entire top surface of the disc-shaped heater.

A disc-shaped heater of the present invention, in which a top surface of a disc-shaped base is sectioned into multiple zones and heating elements are embedded in the base in the respective zones, each heating element including a pair of terminals, the disc-shaped heater, comprises:

terminal collection regions provided on a bottom surface of the base, the number of the terminal collection regions being smaller than a total number of the heating elements, wherein the pair of terminals of each of the heating elements are connected to one of the terminal collection regions through the base.

In this disc-shaped heater, even when the number of heating elements is increased in accordance with the number of zones and the number of terminals is increased accordingly, the number of terminal collection regions is smaller than the total number of terminals. Therefore, although regions of the disc-shaped heater that are directly above the terminal collection regions serve as temperature singular points, the number of temperature singular points can be reduced. As a result, the temperature can be relatively easily equalized over the entire top surface of the disc-shaped heater when the heating elements generate heat.

In the disc-shaped heater according to the present invention, the terminal collection regions may be rectangular regions. In such a case, the rectangular regions may be set so that the short sides thereof have a size similar to that of the terminals and so that the long sides thereof have a size corresponding to the number of terminals arranged in each terminal collection region. Thus, the area of the terminal collection regions can be further reduced.

In the disc-shaped heater according to the present invention, all of the terminal collection regions may together form a rotationally symmetrical shape. Also, all of the terminal collection regions may be disposed on one or more circles concentric with the base.

In the disc-shaped heater according to the present invention, the terminals in each terminal collection region may be connected to a single mounting connector or a single flexible printed circuit (FPC) board. Since mounting connectors and FPC boards are each connectable to multiple terminals, the number of terminals in each terminal collection region can be increased, and the number of terminal collection regions can be reduced accordingly.

In the disc-shaped heater according to the present invention, the base may be a ceramic base, and the disc-shaped heater may be an electrostatic chuck heater. In this case, the temperature equalization control of a wafer placed on the top surface (wafer mounting surface) of the ceramic base can be facilitated.

In the disc-shaped heater according to the present invention, the base may be a resin base, and the disc-shaped heater may be a sheet heater. In such a case, the disc-shaped heater may be produced at a temperature lower than that in the case where the base is a ceramic base. In this case, an electrostatic chuck may be joined to the top surface of the sheet heater. Thus, the temperature equalization control of a wafer placed on the top surface (wafer mounting surface) of the electrostatic chuck can be facilitated.

A heater-cooling-plate assembly according to the present invention includes a disc-shaped heater, which is any one of the above-described disc-shaped heaters, and a cooling plate that is joined to a bottom surface of the disc-shaped heater and that has through holes at positions where the through holes oppose the respective terminal collection regions of the disc-shaped heater. A cross-sectional area of the through holes is equivalent to an area of the terminal collection regions that oppose the through holes.

In this heater-cooling-plate assembly, even when the number of heating elements is increased in accordance with the number of zones and the number of terminals is increased accordingly, the number of terminal collection regions is smaller than the total number of terminals. Therefore, although regions of the disc-shaped heater that are directly above the terminal collection regions (in other words, regions directly above the through holes in the cooling plate) serve as temperature singular points, the number of temperature singular points can be reduced. As a result, the temperature can be relatively easily equalized over the entire top surface of the disc-shaped heater when the heating elements generate heat.

BRIEF DESCRIPTION OF THE DRAWINGS

FIG. 1A is a plan view, and FIG. 1B is a front view.

DETAILED DESCRIPTION OF THE INVENTION

Figure 1A:
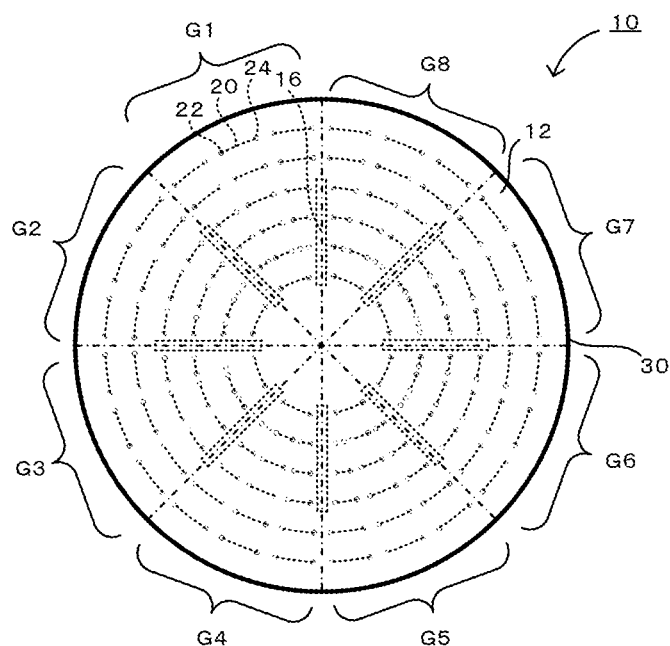
FIGS. 1A and 1B illustrate an electrostatic chuck heater 10 according to the present embodiment.
Figure 1B:
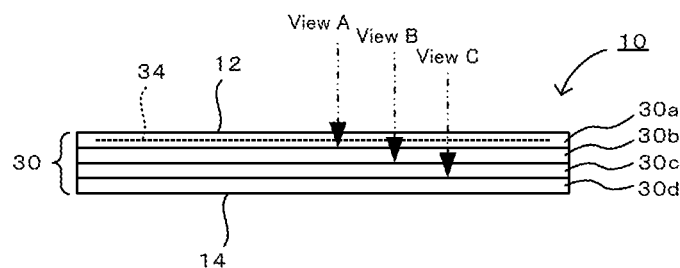
Figure 2:
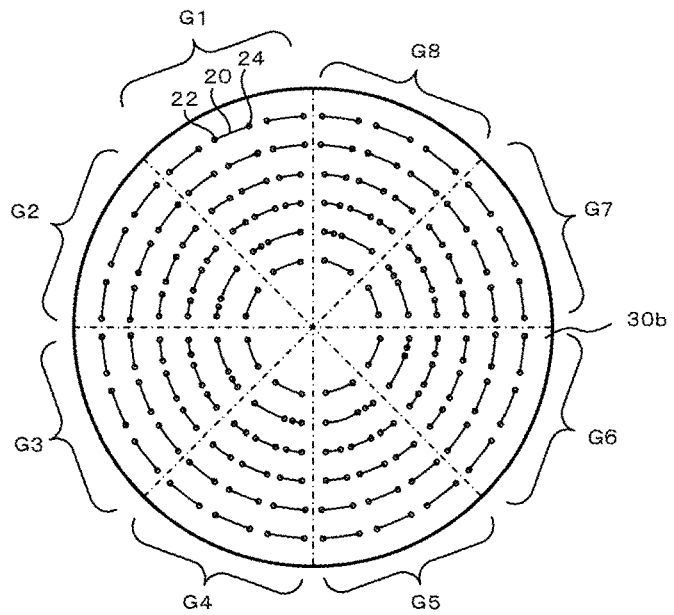
FIG. 2 is a view indicated by arrow A.
Figure 3:
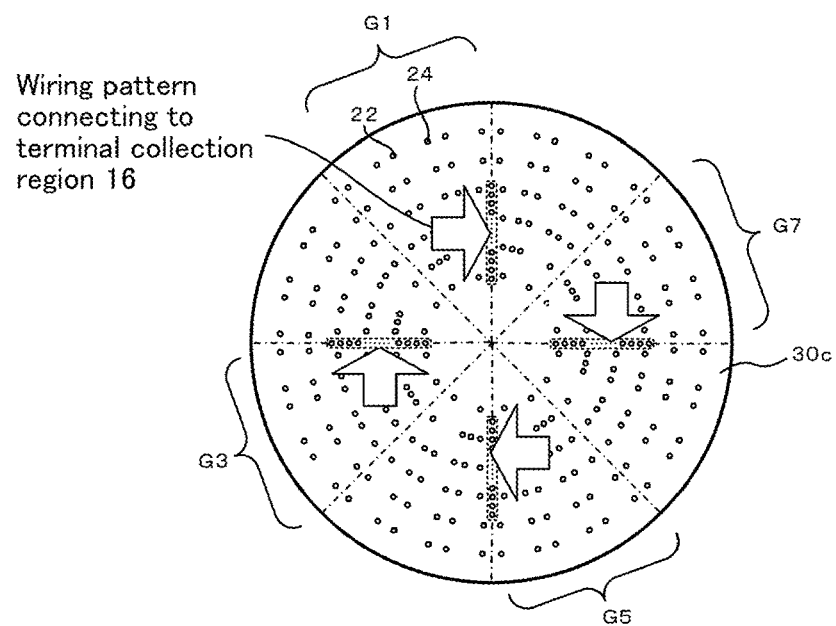
FIG. 3 is a view indicated by arrow B.
Figure 4:
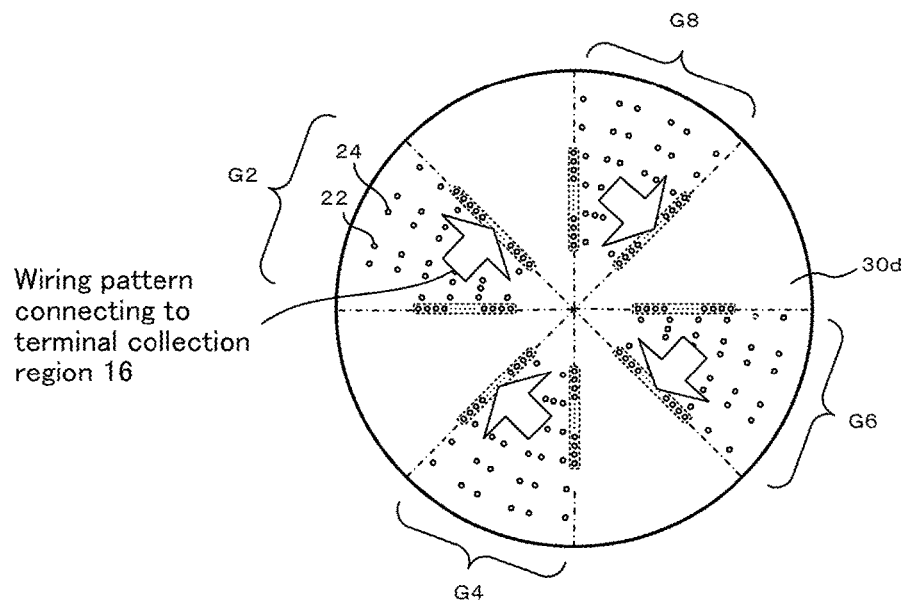
FIG. 4 is a view indicated by arrow C.
Figure 5:
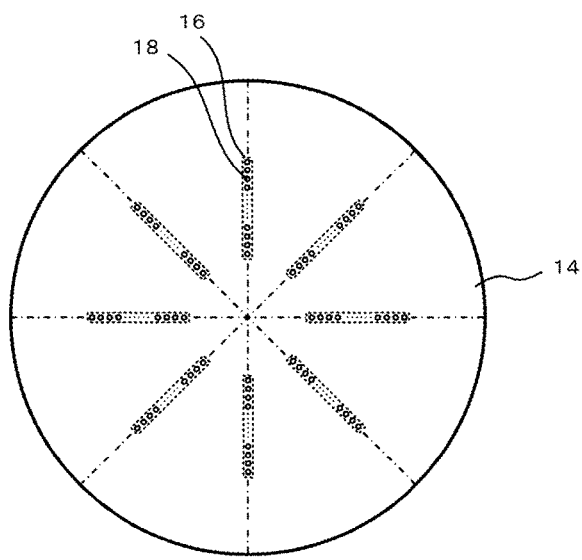
FIG. 5 is a bottom view of the electrostatic chuck heater 10.

FIGS. 1A and 1B illustrate an electrostatic chuck heater 10 according to the present embodiment. FIG. 1A is a plan view, and FIG. 1B is a front view. FIG. 2 is a view indicated by arrow A, FIG. 3 is a view indicated by arrow B, and FIG. 4 is a view indicated by arrow C. FIG. 5 is a bottom view of the electrostatic chuck heater 10.

As illustrated in FIG. 1, the electrostatic chuck heater 10 includes a disc-shaped ceramic base 30 and a plurality of heating elements 20 embedded in the ceramic base 30. The ceramic base 30 is obtained by stacking and joining a plurality of discs made of a ceramic, such as alumina or aluminum nitride. In this example, first to fourth layers 30a to 30d are stacked and joined together. A top surface 12 of the electrostatic chuck heater 10, which serves as a wafer mounting surface, is divided into multiple zones. The heating elements 20, which each include a positive electrode terminal 22 and a negative electrode terminal 24, are embedded in the ceramic base 30 in the respective zones. Thus, each zone is a region in which a single heating element 20 is provided. In the present embodiment, the number of zones is greater than 100. The material of the heating elements may be, for example, Mo, W, a Mo-based alloy, a W-based alloy, Cu, or Ti. The electrostatic chuck heater 10 includes terminal collection regions 16 on a surface opposite the wafer mounting surface, that is, on a bottom surface 14. The number of terminal collection regions 16 (eight in this example) is smaller than the total number of heating elements 20. Multiple terminals 18 (see FIG. 5) are provided in each terminal collection region 16.

All of the heating elements 20 are divided into the same number of groups as the number of terminal collection regions 16 (eight). In the present embodiment, eight sector-shaped regions are defined by one-dot Chain lines illustrated in FIG. 1, and the groups of heating elements 20 that belong to the respective sector-shaped region are defined as groups G1, G2, and so on. The positive electrode terminals 22 and the negative electrode terminals 24 of the heating elements 20 that belong to each group are connected to the terminals 18 of the same terminal collection region 16 that corresponds to that group through the ceramic base 30. The positive electrode terminals 22 and the negative electrode terminals 24 of the heating elements 20 that belong to the same group are connected to a single mounting connector 44 (see FIG. 7) in the same terminal collection region 16. Each positive electrode terminal 22 is connected to a corresponding one of the terminals 18 in the terminal collection region 16. Each negative electrode terminal 24 is also connected to a corresponding one of the terminals 18 in the terminal collection region 16. Alternatively, all of the negative electrode terminals 24 may be collectively connected to a single ground collection terminal. In this case, the ground collection terminal may be provided in one of the terminal collection regions 16 or in a region other than the terminal collection regions 16. Alternatively, the negative electrode terminals 24 of the heating elements 20 that belong to the same group may be collectively connected to a single ground collection terminal provided in the terminal collection region 16 corresponding to that group. Thus, the number of terminals can be reduced, and the size of the terminal collection regions 16 can be reduced accordingly.

All of the terminal collection regions 16 together form a shape including eight rectangles that radially extend from the center. The shape has 8-fold rotational symmetry and overlaps itself when rotated by 45°. Each terminal collection region 16 is disposed between the adjacent groups. Due to the rotational symmetry, the heating elements in the respective zones may be formed in similar patterns. Therefore, the pattern of the heating elements can be easily designed and the difference in temperature distribution between the zones can be reduced. As a result, the temperature uniformity over the entire top surface of the disc-shaped heater can be increased.

The layers 30a to 30d will now be described. As illustrated in FIG. 1B, an electrostatic electrode 34 is embedded in the first layer 30a. As illustrated in FIG. 2, all of the heating elements 20 are provided on a surface of the second layer 30b. As illustrated in FIG. 3, wiring patterns are provided on a surface of the third layer 30c, each wiring pattern connecting the positive electrode terminals 22 and the negative electrode terminals 24 of the heating elements 20 that belong to the same group among the odd-numbered groups G1, G3, G5, and G7 to the terminals 18 of the same terminal collection region 16. In FIG. 3, these wiring patterns are represented by white arrows for convenience. The positive electrode terminals 22 and the negative electrode terminals 24 of the heating elements 20 that belong to the groups G1 to G8 on the second layer 30b are connected to the terminals 22 and 24 on the third layer 30c by through holes that extend through the second layer 30b in a direction perpendicular to the second layer 30b. As illustrated in FIG. 4, wiring patterns are provided on a surface of the fourth layer 30d, each wiring pattern connecting the positive electrode terminals 22 and the negative electrode terminals 24 of the heating elements 20 that belong to the same group among the groups G2, G4, G6, and G8 to the terminals 18 of the same terminal collection region 16. In FIG. 4, these wiring patterns are represented by white arrows for convenience. The positive electrode terminals 22 and the negative electrode terminals 24 of the heating elements 20 that belong to the groups G2, G4, G6, and G8 on the third layer 30c are connected to the terminals 22 and 24 on the fourth layer 30d by through holes that extend through the third layer 30c in a direction perpendicular to the third layer 30c. FIG. 5 is a bottom view of the electrostatic chuck heater 10. The terminals 18 in the terminal collection regions 16 are exposed at the bottom surface 14.

The electrostatic chuck heater 10 may be produced by using, for example, the well-known gel casting method (see, for example, Japanese Unexamined Patent Application Publication No. 2013-229310). Although the ceramic base 30 and a cooling plate 50 each have a passage hole for receiving a power supply rod through which power is supplied to the electrostatic electrode 34, the passage holes are not illustrated.

Figure 6:
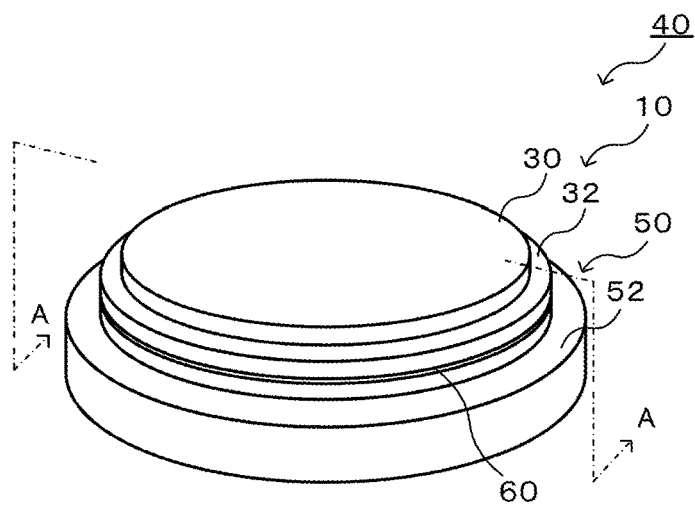
FIG. 6 is a perspective view of a heater-cooling-plate assembly 40.
Figure 7:
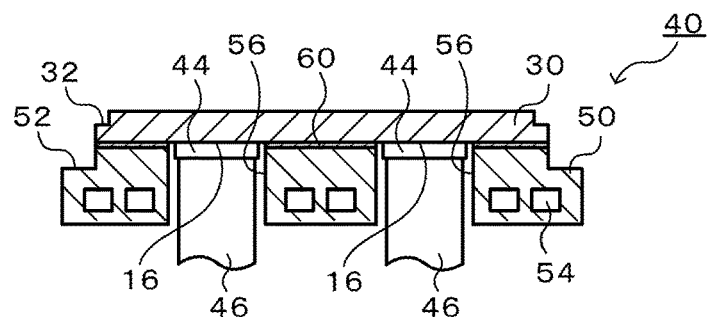
FIG. 7 is a sectional view taken along line A-A.
Figure 8:
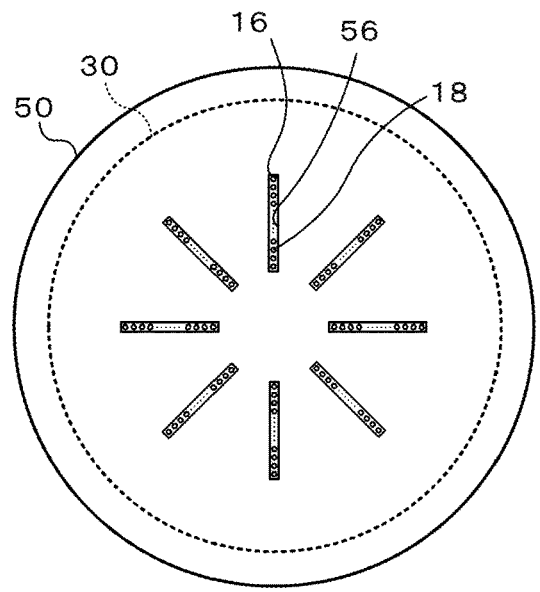
FIG. 8 is a bottom view of a cooling plate 50.

A usage example of the electrostatic chuck heater 10 will now be described with reference to FIGS. 6 to 8. FIG. 6 is a perspective view of a heater-cooling-plate assembly 40. FIG. 7 is a sectional view taken along line A-A (sectional view taken along the longitudinal direction of the terminal collection regions 16). FIG. 8 is a bottom view of the cooling plate 50.

First, the ceramic base 30 of the electrostatic chuck heater 10 is formed into a certain shape by grinding. At this time, a step 32 is formed at the outer periphery of the ceramic base 30. Next, a disc-shaped cooling plate 50 is joined to the bottom surface of the electrostatic chuck heater 10 by a joining layer 60. The disc-shaped cooling plate 50 is made of aluminum and includes cooling channels 54 (see FIG. 7) through which coolant flows. In this example, the cooling plate 50 has a step 52 at the outer periphery thereof. The material of the joining layer 60 may be, for example, a silicone resin, an acrylic resin, or an epoxy resin. Slits (through holes) 56 having the same or substantially the same size (area) as that of the terminal collection regions 16 are formed in the cooling plate 50 at positions such that the slits 56 oppose the respective terminal collection regions 16 of the electrostatic chuck heater 10. The mounting connectors 44 are inserted into the slits 56 in the cooling plate 50. Thus, the mounting connectors 44 are connected to the terminals 18 in the terminal collection regions 16 of the electrostatic chuck heater 10. Flat cables 46 are connected to the mounting connectors 44. The flat cables 46 extend to the outside through the slits 56 in the cooling plate 50. Thus, the temperature of each zone can be controlled by adjusting the voltage or current supplied to the corresponding heating element 20 through the corresponding mounting connector 44. Regions of the top surface 12 of the electrostatic chuck heater 10 that are directly above the terminal collection regions 16 tend to become heat spots because heat is not extracted therefrom by the cooling plate 50. Therefore, the heating elements 20 are preferably spaced from the peripheries of the terminal collection regions 16 to prevent the generation of heat spots by reducing the amount of heat generated by the heating elements 20.

The present embodiment described in detail above has the following effects. When the number of heating elements 20 and the number of zones are increased, the number of terminals (positive electrode terminals 22 and negative electrode terminals 24) of the heating elements 20 is increased accordingly. In such a case, normally, the terminals of all of the heating elements 20 are exposed at the bottom surface of the electrostatic chuck heater, and the same number of through holes as the number of terminals of the heating elements 20 are formed in the cooling plate. The regions of the electrostatic chuck heater that are directly above the through holes differ from other regions in the amount of heat extraction, and therefore tend to become temperature singular points (for example, heat spots) when heat is generated. As the number of temperature singular points increases, the temperature equalization control becomes more difficult. In contrast, in the electrostatic chuck heater 10, even when the number of terminals of the heating elements 20 is increased, the number of terminal collection regions 16 is smaller than the total number of terminals of the heating elements 20 because the terminals of a plurality of heating elements 20 are collected at each terminal collection region 16. The number of slits 56 in the cooling plate 50 is also small. Therefore, although the regions of the electrostatic chuck heater 10 that are directly above the terminal collection regions 16 differ from other regions in the amount of heat extraction, the number of temperature singular points can be reduced, and the total opening area of the slits 56 in the cooling plate 50 can also be reduced. As a result, the temperature equalization control can be facilitated. The number of terminals can also be reduced by sharing or integration of the negative electrode terminals 24, and the size of the terminal collection regions 16 can be reduced accordingly. Thus, the total opening area of the slits 56 can be reduced and the temperature equalization control can be facilitated.

Since the terminals of the heating elements 20 are collected at the terminal collection regions 16, the size of a joining portion for each terminal is much smaller than that in the structure of the related art.

Furthermore, since the terminal collection regions 16 are rectangular regions, the rectangular regions may be set so that the short sides thereof have a size close to that of the terminals 18 and so that the long sides thereof have a size corresponding to the number of terminals 18 arranged in each terminal collection region 16. Thus, the area of the terminal collection regions 16 can be further reduced.

Furthermore, since each mounting connector 44 is connectable to multiple terminals, the number of terminals 18 in each terminal collection region 16 can be increased, and the number of terminal collection regions 16 can be reduced accordingly.

The present invention is not limited to the above-described embodiment in any way, and it goes without saying that the present invention may be implemented in various forms within the technical scope thereof.

For example, although the mounting connectors 44 are connected to the terminal collection regions 16 in the above-described embodiment, flexible printed circuit (FPC) boards may be joined to the terminal collection regions 16 instead of the mounting connectors 44. The FPC boards may be joined to the terminal collection regions 16 by using, for example, a solder, a metal brazing material, or a conductive paste. Both the mounting connectors 44 and the FPC boards are each connectable to multiple terminals 18 in the corresponding terminal collection region 16. Each FPC board, for example, is connectable to about 120 terminals 18 at a maximum. Thus, the number of terminals 18 in each terminal collection region 16 can be increased, and the number of terminal collection regions 16 can be reduced accordingly.

In the above-described embodiment, the electrostatic chuck heater 10, in which the electrostatic electrode 34 and the heating elements 20 are embedded, is described as an example of a disc-shaped heater. However, the disc-shaped heater is not limited to this. For example, a disc-shaped sheet heater may be produced by using a resin substrate that is free from the electrostatic electrode 34 instead of the ceramic base 30. The sheet heater is made of a resin, and therefore can be produced at a temperature lower than that in the case where the electrostatic chuck heater 30, which is made of a ceramic, is produced. An electrostatic chuck heater may be formed by joining an electrostatic chuck made of a ceramic in which the electrostatic electrode 34 is embedded to the top surface of the sheet heater and joining a cooling plate made of aluminum to the bottom surface of the sheet heater. In this case, since the sheet heater having a structure similar to that in the above-described embodiment is used, the temperature equalization control of a wafer placed on the top surface (wafer mounting surface) of the electrostatic chuck can be facilitated.

In the above-described embodiment, the positive electrode terminal 22 and the negative electrode terminal 24 of each heating element 20 are connected to each other by a heater line that is straight or arc-shaped. However, the heater line may have any shape that can be drawn with one stroke.

Figure 9:
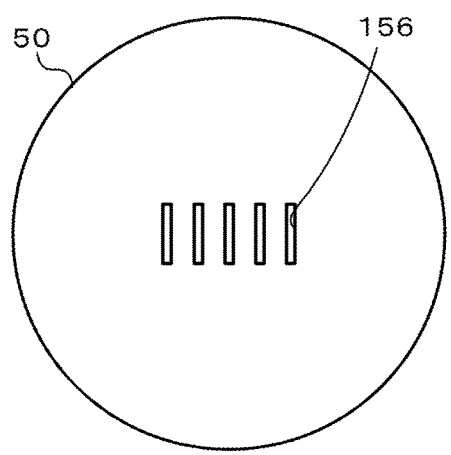
FIG. 9 is a bottom view of a cooling plate 50 according to another embodiment.
Figure 10:
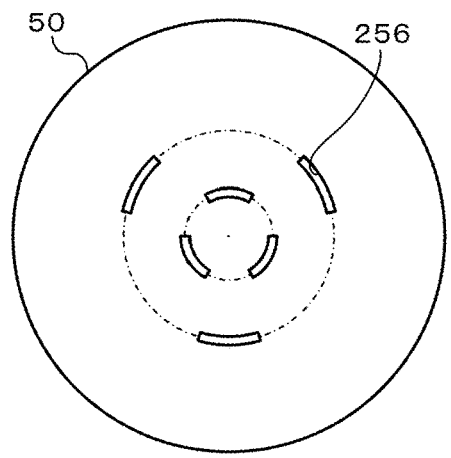
FIG. 10 is a bottom view of a cooling plate 50 according to another embodiment.
Figure 11:
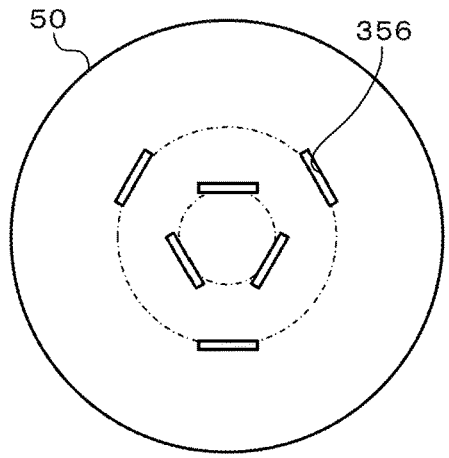
FIG. 11 is a bottom view of a cooling plate 50 according to another embodiment.

Although the terminal collection regions 16 are radially arranged in the above-described embodiment, the arrangement is not particularly limited to this. For example, the terminal collection regions 16 may instead be arranged in parallel in a central region of the ceramic base 30. FIG. 9 illustrates slits 156 formed in the cooling plate 50 in this case. Alternatively, the terminal collection regions 16 may be formed in an arc shape and arranged along circles concentric with the outer peripheral circle of the ceramic base 30. FIG. 10 illustrates slits 256 formed in the cooling plate 50 in this case. Alternatively, the terminal collection regions 16 may be arranged to be tangent to the concentric circles. FIG. 11 illustrates slits 356 formed in the cooling plate 50 in this case. Also in FIGS. 9 to 11, the slits 156, 256, and 356 are formed at positions such that the slits oppose the respective terminal collection regions 16. Therefore, in FIGS. 9 to 11, the shapes of the terminal collection regions 16 are the same as those of the slits 156, 256, and 356.

In the above-described embodiment, the positive electrode terminals 22 and the negative electrode terminals 24 are used as the terminals of the heating elements 20. This is because it is assumed that a direct-current power supply is used. When an alternating-current power supply is used, it is not necessary to distinguish between positive and negative electrodes.

In the above-described embodiment, the heating elements 20 are divided into groups that belong to eight sector-shaped regions, and the terminal collection regions 16 are provided for the respective groups. However, the heating elements 20 are not necessarily distributed among sector-shaped regions, and may be distributed among regions having any shape. For example, the heating elements 20 may instead be distributed among a plurality of annular regions that are concentric with the ceramic base 30, or among regions obtained by dividing the annular regions with radial lines.

What is claimed is:

1. A disc-shaped heater in which a top surface of a disc-shaped base is sectioned into multiple zones and heating elements are embedded in the base in the respective zones, each heating element including a pair of terminals, the disc-shaped heater comprising:
    terminal collection regions provided on a bottom surface of the base, the number of the terminal collection regions being smaller than a total number of the heating elements,
    wherein the pair of terminals of each of the heating elements are connected to one of the terminal collection regions through the base,
    wherein the terminal collection regions are one of formed in (i) an arc shape and arranged along a plurality of circles concentric with the outer peripheral circle of the ceramic base, or (ii) a rectangular shape and arranged to be tangent to a plurality of circles concentric with the outer peripheral circle of the ceramic base, and
    wherein each concentric circle comprises a plurality of the terminal collection regions that together form a rotationally symmetrical shape in the concentric circle.

2. The disc-shaped heater according to claim 1, wherein the terminals in each terminal collection region are connected to a single mounting connector or a single flexible printed circuit (FPC) board.

3. The disc-shaped heater according to claim 1, wherein the base is a ceramic base, and the disc-shaped heater is an electrostatic chuck heater.

4. The disc-shaped heater according to claim 1, wherein the base is a resin base, and the disc-shaped heater is a sheet heater.

5. The disc-shaped heater according to claim 1, wherein
    the pair of terminals of each of the heating elements consists of a positive electrode terminal and a negative electrode terminal,
    each of the terminal collection regions has a single ground collection terminal, and
    the negative electrode terminals that belong to the same terminal collection region are collectively connected to the single ground collection terminal.

6. A heater-cooling-plate assembly comprising:
    the disc-shaped heater according to claim 1; and
    a cooling plate that is joined to a bottom surface of the disc-shaped heater and that has through holes at positions such that the through holes oppose the respective terminal collection regions of the disc-shaped heater,
    wherein a cross-sectional area of the through holes is equivalent to an area of the terminal collection regions that oppose the through holes.

* * * * *